(12) United States Patent
Yokoyama et al.

(10) Patent No.: US 12,143,090 B2
(45) Date of Patent: Nov. 12, 2024

(54) SURFACE ACOUSTIC WAVE (SAW) STRUCTURES WITH TRANSVERSE MODE SUPPRESSION

(71) Applicant: Qorvo US, Inc., Greensboro, NC (US)

(72) Inventors: Tsuyoshi Yokoyama, Hyogo (JP); Tabito Tanaka, Osaka (JP); Jun Sung Chun, High Point, NC (US)

(73) Assignee: Qorvo US, Inc., Greensboro, NC (US)

( * ) Notice: Subject to any disclaimer, the term of this patent is extended or adjusted under 35 U.S.C. 154(b) by 323 days.

(21) Appl. No.: 17/452,825

(22) Filed: Oct. 29, 2021

(65) Prior Publication Data

US 2023/0133161 A1 May 4, 2023

(51) Int. Cl.
| H03H 9/02 | (2006.01) |
| H03H 9/54 | (2006.01) |
| H03H 9/64 | (2006.01) |

(52) U.S. Cl.
CPC .......... *H03H 9/02015* (2013.01); *H03H 9/54* (2013.01); *H03H 9/6453* (2013.01)

(58) Field of Classification Search
None
See application file for complete search history.

(56) References Cited

U.S. PATENT DOCUMENTS

| 6,791,236 B1 | 9/2004 | Abramov | |
| 7,479,855 B2* | 1/2009 | Yata | H03H 9/14532 |
| | | | 333/195 |
| 7,482,896 B2 | 1/2009 | Wada et al. | |
| 7,522,021 B2 | 4/2009 | Wada et al. | |
| 7,576,471 B1* | 8/2009 | Solal | H03H 9/1457 |
| | | | 310/313 B |
| 7,800,464 B2 | 9/2010 | Tajima et al. | |
| 7,939,989 B2* | 5/2011 | Solal | H03H 9/1452 |
| | | | 310/313 C |
| 8,294,331 B2* | 10/2012 | Abbott | H03H 9/1452 |
| | | | 29/25.35 |
| 9,350,320 B2* | 5/2016 | Kishino | H03H 9/54 |
| 9,673,779 B2* | 6/2017 | Ruile | H03H 9/1457 |
| 9,712,139 B2* | 7/2017 | Taniguchi | H03H 9/6426 |
| 10,009,009 B2* | 6/2018 | Mimura | H03H 9/1457 |
| 10,171,061 B2* | 1/2019 | Iwamoto | H03H 9/1457 |

(Continued)

FOREIGN PATENT DOCUMENTS

| WO | 2019172374 A1 | 9/2019 |
| WO | 2019197086 A1 | 10/2019 |

OTHER PUBLICATIONS

Extended European Search Report for European Patent Application No. 22202612.2, mailed Mar. 23, 2023, 9 pages.

(Continued)

*Primary Examiner* — Kenneth B Wells
(74) *Attorney, Agent, or Firm* — Withrow & Terranova, P.L.L.C.

(57) ABSTRACT

Surface acoustic wave (SAW) structures with transverse mode suppression are disclosed. In one aspect, the SAW structure provides digits or fingers with broad interior terminal end shapes. By providing such shapes spurious modes above the resonance frequency of the SAW are suppressed thereby providing desired out of band rejection that helps satisfy design criteria such as keeping a higher Q value, a higher K2 value and better Temperature Coefficient of Frequency (TCF).

19 Claims, 11 Drawing Sheets

(56) References Cited

U.S. PATENT DOCUMENTS

| | | | |
|---|---|---|---|
| 10,382,008 B2* | 8/2019 | Kim | H03H 9/64 |
| 10,418,970 B2* | 9/2019 | Daimon | H03H 9/1457 |
| 10,454,449 B2* | 10/2019 | Mimura | H03H 9/14544 |
| 10,840,881 B2* | 11/2020 | Takigawa | H03H 9/02559 |
| 10,862,452 B2* | 12/2020 | Okada | H03H 9/14532 |
| 11,165,411 B2* | 11/2021 | Liu | H03H 9/725 |
| 11,171,627 B2 | 11/2021 | Inoue et al. | |
| 11,177,791 B2* | 11/2021 | Solal | H03H 9/1457 |
| 11,496,116 B2* | 11/2022 | Takata | H03H 9/1452 |
| 11,522,514 B2* | 12/2022 | Zou | H03H 9/02086 |
| 11,611,325 B2* | 3/2023 | Suzuki | H03H 9/02921 |
| 2004/0247153 A1 | 12/2004 | Ruile et al. | |
| 2007/0046400 A1 | 3/2007 | Wada et al. | |
| 2008/0309192 A1 | 12/2008 | Nakao et al. | |
| 2009/0295507 A1 | 12/2009 | Kando et al. | |
| 2017/0033765 A1 | 2/2017 | Moriya et al. | |
| 2017/0222618 A1 | 8/2017 | Inoue et al. | |

OTHER PUBLICATIONS

Inoue, Shogo, et al., "Low-Loss SAW Filter on $Li_2B_4O_7$ using Novel-Shape Apodized Structure for 1 GHz RF-ID System," IEEE Ultrasonics Symposium, Sep. 2005, pp. 1036-1041.

Non-Final Office Action for U.S. Appl. No. 16/400,363, mailed Jul. 9, 2020, 12 pages.

Final Office Action for U.S. Appl. No. 16/400,363, mailed Dec. 10, 2020, 14 pages.

Applicant-Initiated Interview Summary for U.S. Appl. No. 16/400,363, mailed Feb. 23, 2021, 2 pages.

Notice of Allowance for U.S. Appl. No. 16/400,363, mailed Jul. 14, 2021, 7 pages.

Notice of Allowance for U.S. Appl. No. 17/521,316, mailed May 20, 2024, 7 pages.

Non-Final Office Action for U.S. Appl. No. 17/521,316, mailed Feb. 1, 2024, 15 pages.

* cited by examiner

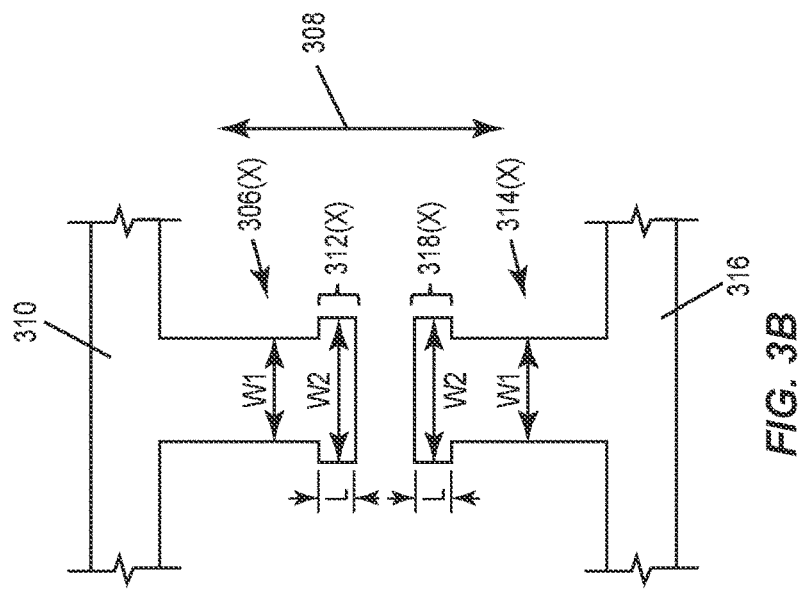
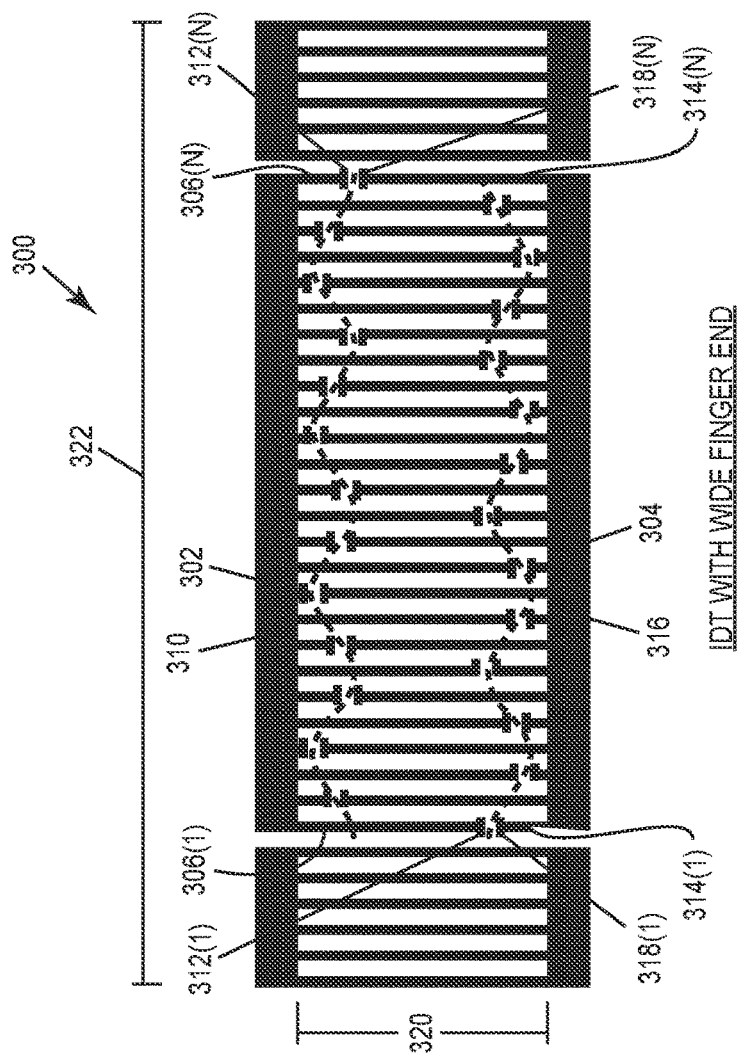
FIG. 3B
FIG. 3A
IDT WITH WIDE FINGER END

FIG. 7C (not labeled; top right graph)

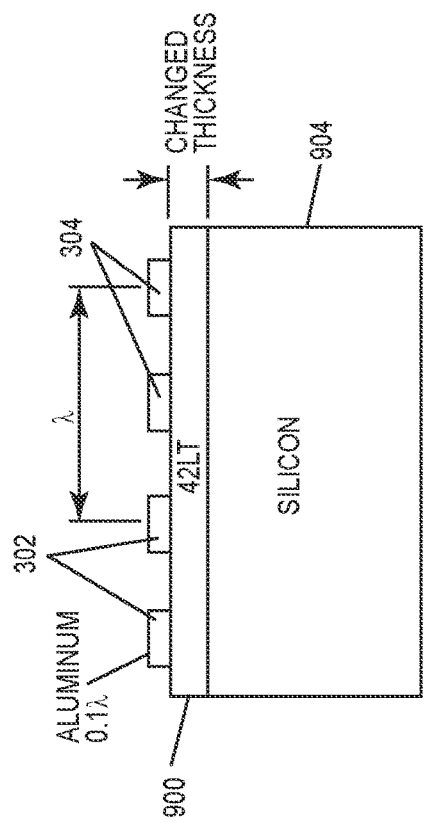
FIG. 9A
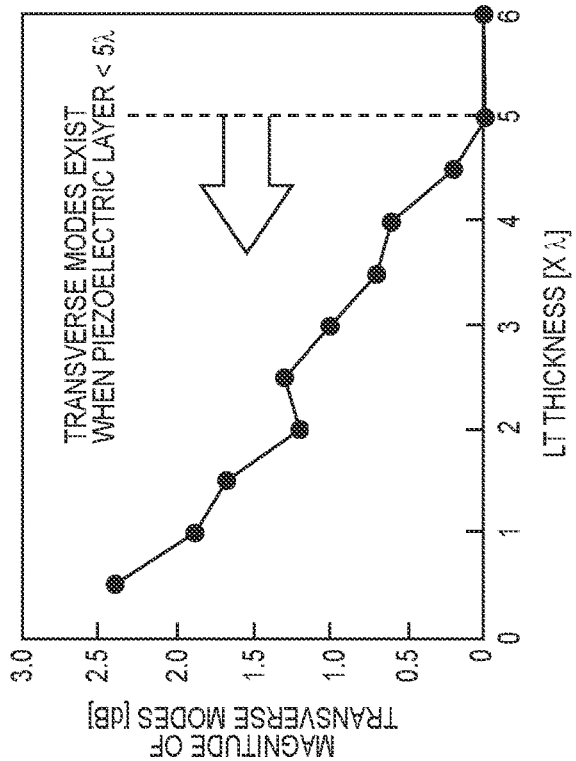
FIG. 9B
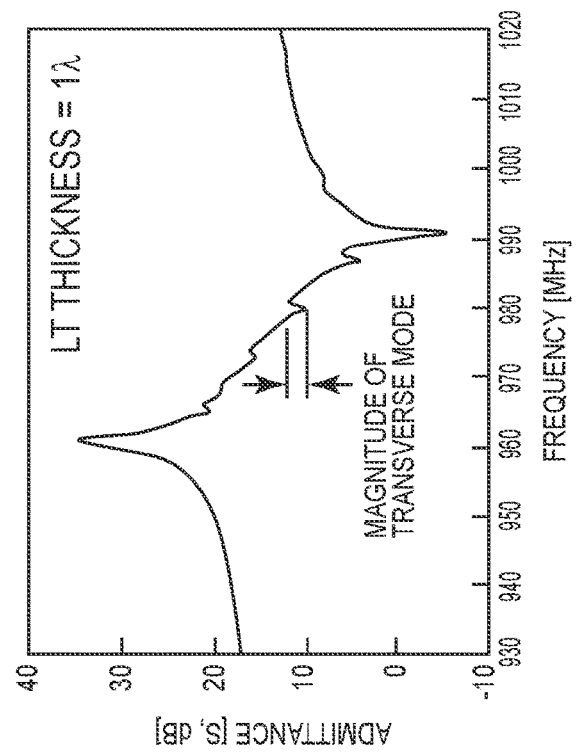

SURFACE ACOUSTIC WAVE (SAW) STRUCTURES WITH TRANSVERSE MODE SUPPRESSION

BACKGROUND

I. Field of the Disclosure

The technology of the disclosure relates generally to surface acoustic waves and ways to reduce transverse modes spurious around resonance frequencies.

II. BACKGROUND

Surface acoustic wave (SAW) devices, such as SAW resonators and SAW filters, are used in many applications such as radio frequency (RF) filters. For example, SAW filters are commonly used in Second Generation (2G), Third Generation (3G), and Fourth Generation (4G) wireless transceiver front ends, duplexers, and receive filters. The widespread use of SAW filters is due to, at least in part, the fact that SAW filters exhibit low insertion loss with good rejection, can achieve broad bandwidths, and are a small fraction of the size of traditional cavity and ceramic filters. As with any electronic device, the performance of a SAW device is an important parameter that can impact the overall performance of a system. In this regard, there is a need for a high-performance SAW device. One such solution is a guided SAW device.

Guided SAW devices (i.e., SAW devices having a guided SAW structure) have a layered substrate where a layer of piezoelectric material, which is referred to here as a piezoelectric layer, is bonded or deposited on (e.g., directly on) the surface of a support, or carrier, substrate. As compared to conventional SAW devices, guided SAW devices have an improved quality factor (Q), an improved electromechanical coupling factor (K2), and an improved Temperature Coefficient of Frequency (TCF). However, unwanted spurious modes are typically generated in a guided SAW structure, which hinders a practical use of a guided SAW device. In particular, in a guided SAW device, spurious modes are generated above the resonance frequency of the guided SAW device and, as a result, out-of-band rejection specifications may not be satisfied. Accordingly, there is still a need for improved performance from SAW devices.

SUMMARY

Aspects disclosed in the detailed description include surface acoustic wave (SAW) structures with transverse mode suppression. In particular, exemplary aspects of the present disclosure provide digits or fingers with broad interior terminal end shapes. By providing such shapes, spurious modes above the resonance frequency of the SAW structure are suppressed, thereby providing desired out-of-band rejection that helps satisfy design criteria such as keeping a higher quality factor (Q) value, a higher electromechanical coupling factor (K2) value, and better Temperature Coefficient of Frequency (TCF).

In this regard in one aspect, a SAW filter is disclosed. The SAW filter comprises a first interdigitated electrode comprising a first finger. The first finger has a first width along a longitudinal axis of the first finger for a first length and a second width along the longitudinal axis of the first finger for a second length at a terminal end portion of the first finger. The SAW filter also comprises a second interdigitated electrode.

BRIEF DESCRIPTION OF THE DRAWINGS

FIG. 3A illustrates a guided SAW structure with transverse mode suppression according to an exemplary aspect of the present disclosure;

FIG. 3B illustrates an exemplary finger end used on the interdigital structure to facilitate transverse mode suppression;

FIGS. 9A and 9B illustrate how changing a substrate thickness may affect a magnitude of a transverse mode.

DETAILED DESCRIPTION

Figure 1A:
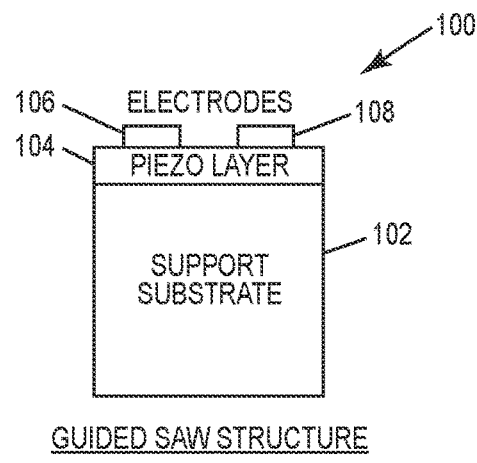
FIG. 1A is a side elevational view of a guided surface acoustic wave (SAW) structure.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include surface acoustic wave (SAW) structures with transverse mode suppression. In particular, exemplary aspects of the present disclosure provide digits or fingers with broad interior terminal end shapes. By providing such shapes, spurious modes above the resonance frequency of the SAW structure are suppressed, thereby providing desired out-of-band rejection that helps satisfy design criteria such as keeping a higher quality factor (Q) value, a higher electromechanical coupling factor (K2) value, and better Temperature Coefficient of Frequency (TCF).

Figure 1B:
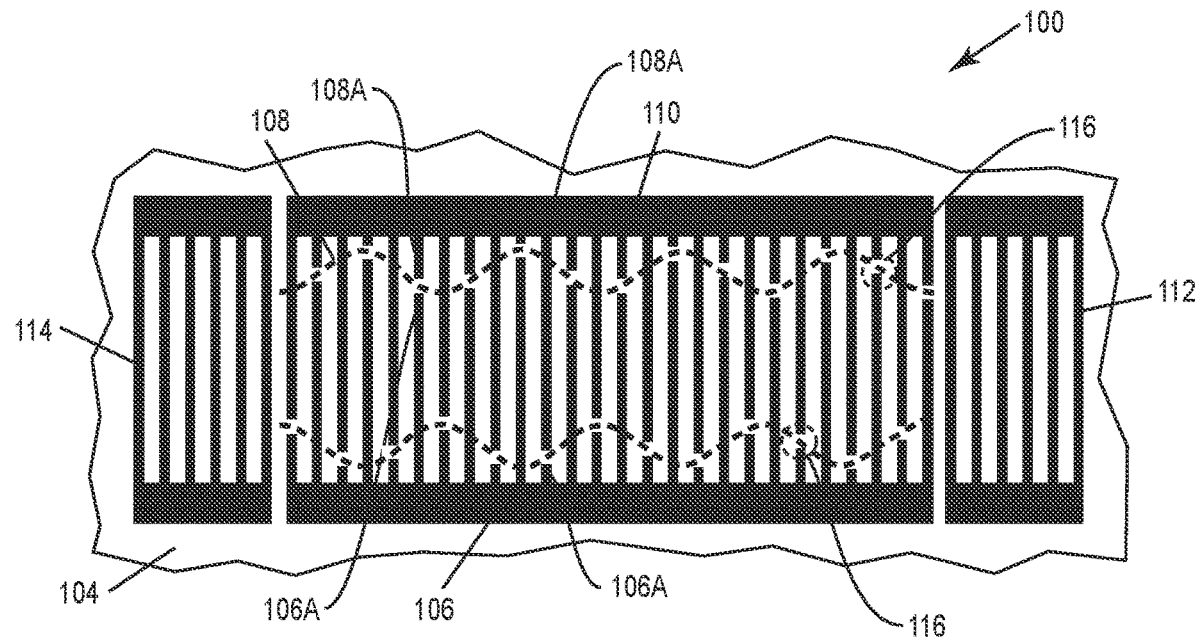
FIG. 1B is a top plan view of the guided SAW structure of FIG. 1B with apodization of the interdigital structure.

FIGS. 1A and 1B illustrate a conventional guided SAW structure 100 having a support substrate 102 on which a piezoelectric layer 104 is positioned. Interdigitated electrodes 106, 108 are positioned on the piezoelectric layer 104 as better seen in FIG. 1B. The interdigitated electrodes 106, 108 form an interdigital transducer (IDT) 110 with optional reflectors 112, 114. Further, one of the interdigitated electrodes 106, 108 (e.g., electrode 108) may be a dummy electrode.

With continued reference to FIG. 1B, each interdigitated electrode 106, 108 includes a respective plurality of fingers 106A, 108A that are aligned with one another and are separated by gaps 116. The alignment and presence of the gaps 116 provide apodization of the IDT 110.

Figure 2:
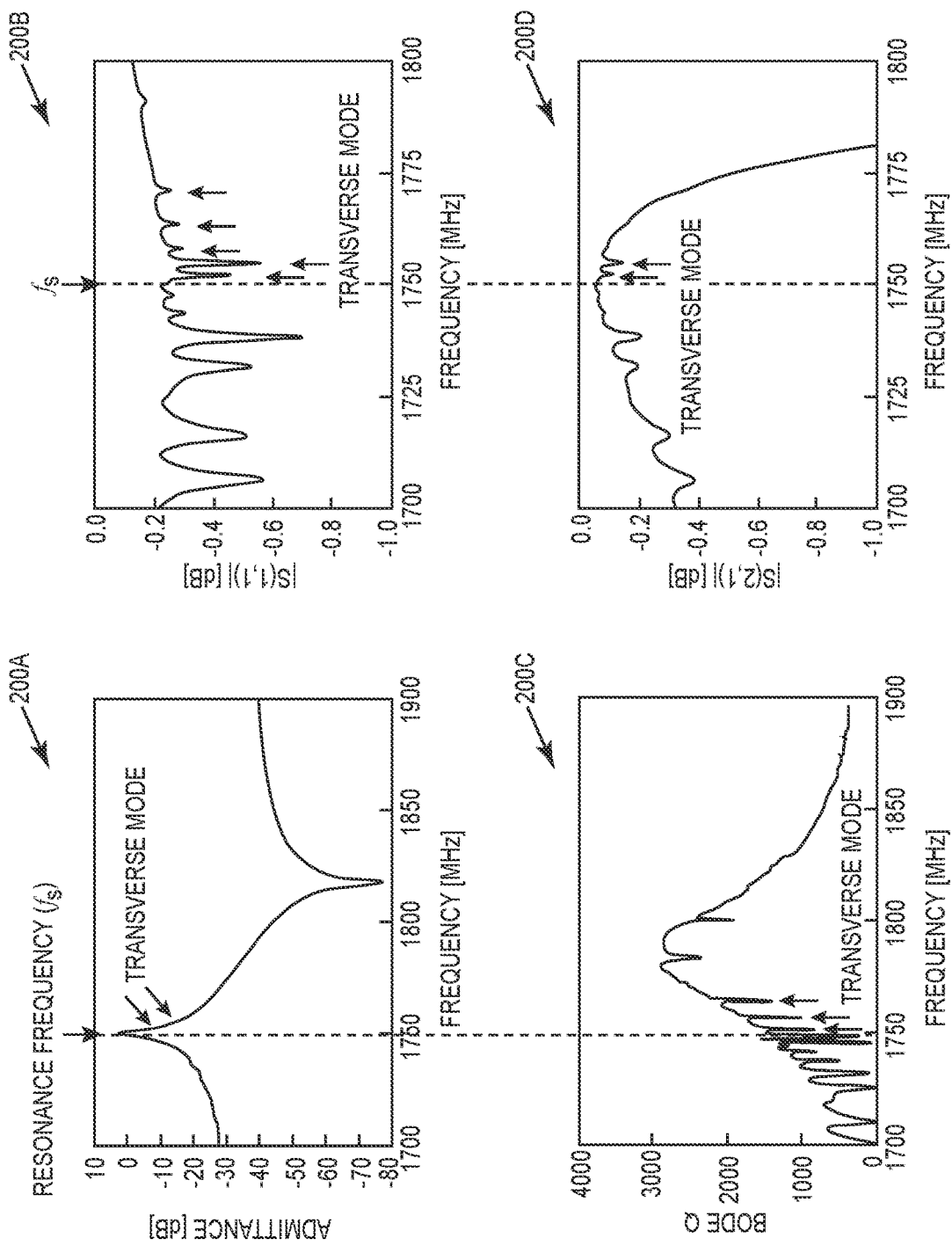
FIG. 2 provides performance graphs for the guided SAW structure of FIGS. 1A and 1B with transverse modes above the resonant frequency highlighted.

FIG. 2 provides various graphs 200A-200D showing performance of the guided SAW structure 100 against frequency, and particularly shows a resonance frequency f, with transverse modes proximate the resonance frequency highlighted. As is readily apparent, while the apodization does some work at suppressing the transverse modes, it is insufficient for some purposes.

As illustrated in FIGS. 3A and 3B, exemplary aspects of the present disclosure provide a guided SAW filter 300 that includes a first interdigitated electrode 302 and a second interdigitated electrode 304 that are apodized. The first interdigitated electrode 302 has a plurality of fingers 306(1)-306(N) with an exemplary finger 306(X) shown in FIG. 3B. Each of the fingers 306(1)-306(N) has a first width W1 along a longitudinal axis 308 of the fingers 306(1)-306(N). The first width W1 is provided along this longitudinal axis 308 for a first length defined by the distance between a lateral bar 310 and a terminal end portion 312(1)-312(N) of the finger 306(1)-306(N). The terminal end portion 312(1)-312(N) of the finger 306(1)-306(N) has a second width W2 along the longitudinal axis 308 for a second length L (see also FIG. 5A). The apodization is perpendicular to the longitudinal axis 308 and may be described as being along a length direction of the SAW structure 100. Further, the apodization is formed in a wave pattern and may follow a sine or cosine wave pattern.

Similarly, the second interdigitated electrode 304 has a plurality of fingers 314(1)-314(N) with an exemplary finger 314(X) shown in FIG. 3B. Each of the fingers 314(1)-314(N) has a first width W1 along the longitudinal axis 308. The first width W1 is provided along this longitudinal axis 308 for a length defined by the distance between a lateral bar 316 and a terminal end portion 318(1)-318(N) of the finger 314(1)-314(N). The terminal end portion 318(1)-318(N) of the finger 314(1)-314(N) has a second width W2 along the longitudinal axis 308 for a second length L (see also FIG. 5A).

Note that, as illustrated, both the fingers 306(1)-306(N) and the fingers 314(1)-314(N) include the wider terminal end portions 312(1)-312(N), 318(1)-318(N). However, the disclosure is not so limited and only one or the other of the fingers 306(1)-306(N) or 314(1)-314(N) may include the wider terminal end portions 312(1)-312(N), 318(1)-318(N). Note further that, as illustrated, the widths W1 of the fingers 306(1)-306(N) are the same as the widths W1 of the fingers 314(1)-314(N), but such identity is not required by the present disclosure and the W1 of fingers 306(1)-306(N) may differ from the W1 of the fingers 314(1)-314(N). Still further, even if both fingers 306(1)-306(N) and 314(1)-314(N) have the wider terminal end portions 312(1)-312(N), 318(1)-318(N), they do not necessarily have to have the same widths W2 relative to each other.

Figure 4:
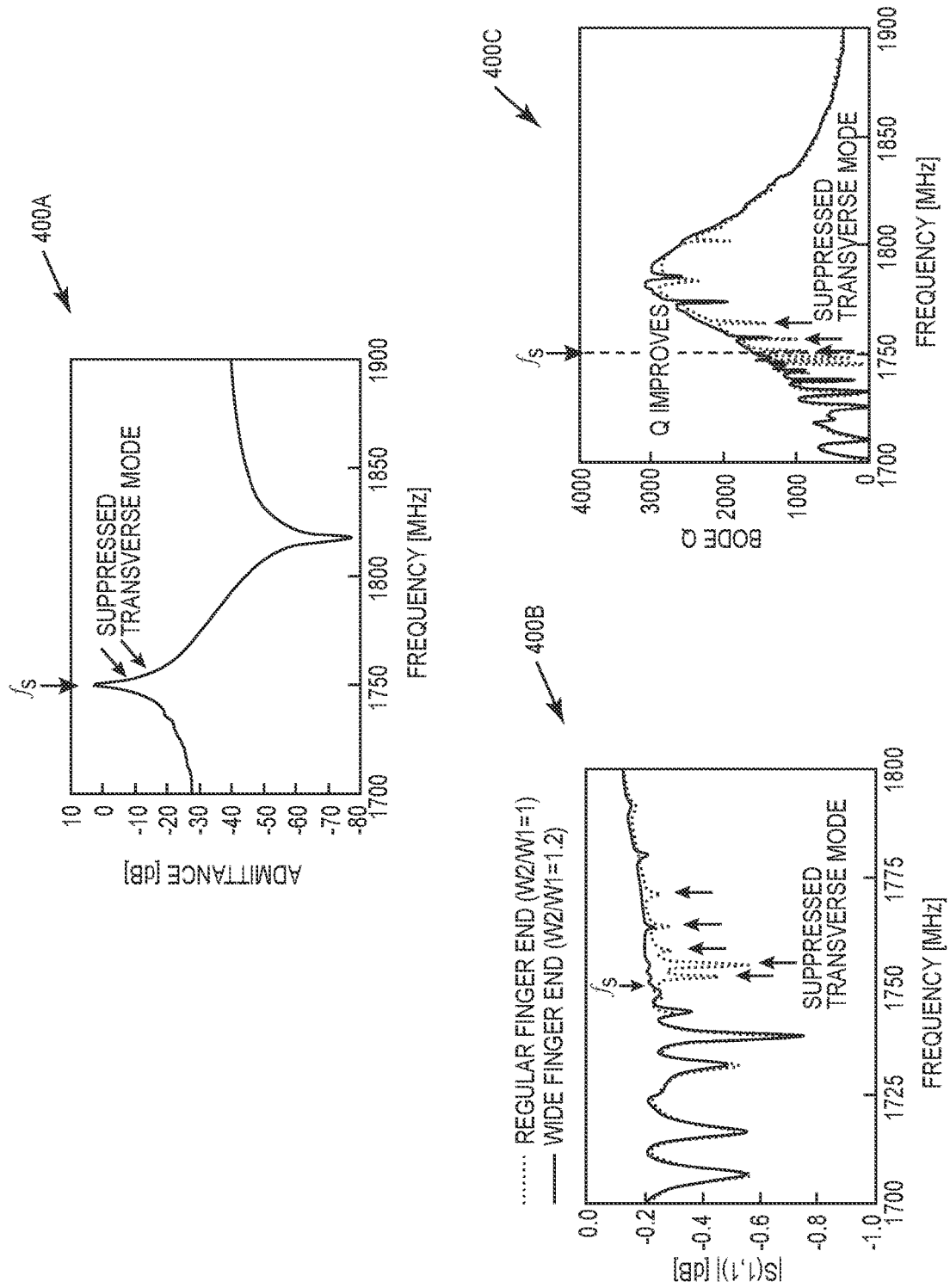
FIG. 4 provides performance graphs for the guided SAW structure with wide finger ends of FIGS. 3A and 3B highlighting the suppressed transverse modes.

FIG. 4 provides graphs 400A-400C illustrating how the guided SAW filter 300 suppresses the transverse modes. For reference, the wave amplitude of the apodization is 2.4λ. The aperture 320, length 322, and IDT length/wave were set to 20λ, 100λ, and 1λ, respectively. By using the wide finger ends, the transverse modes can be significantly suppressed, and Q also improves. λ is an interdigital transducer (IDT) period of the SAW filter 300.

Figure 5A:
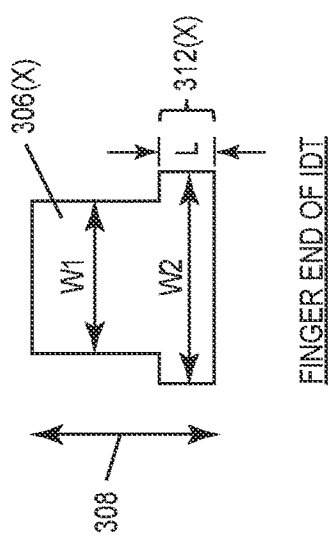
FIGS. 5A and 5B illustrate how changing a width of a finger end relative to the finger shaft affects a magnitude of a transverse mode.
Figure 5B:
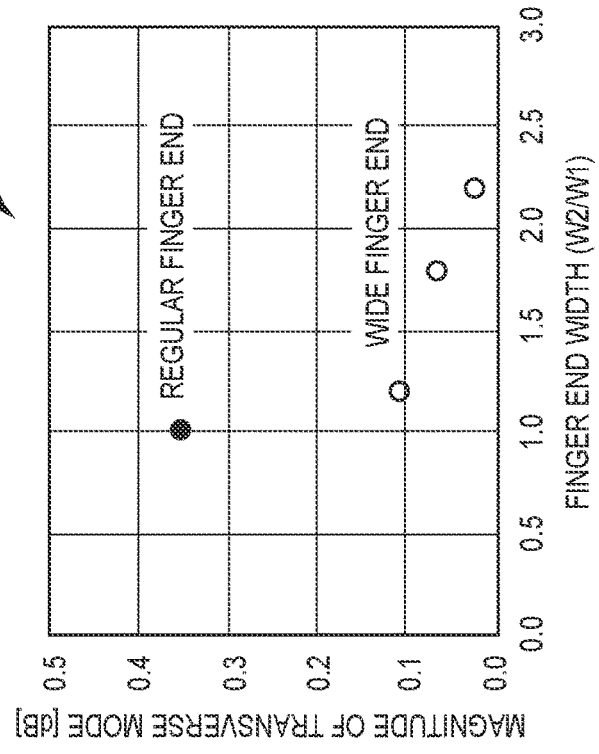
Figure 5A:
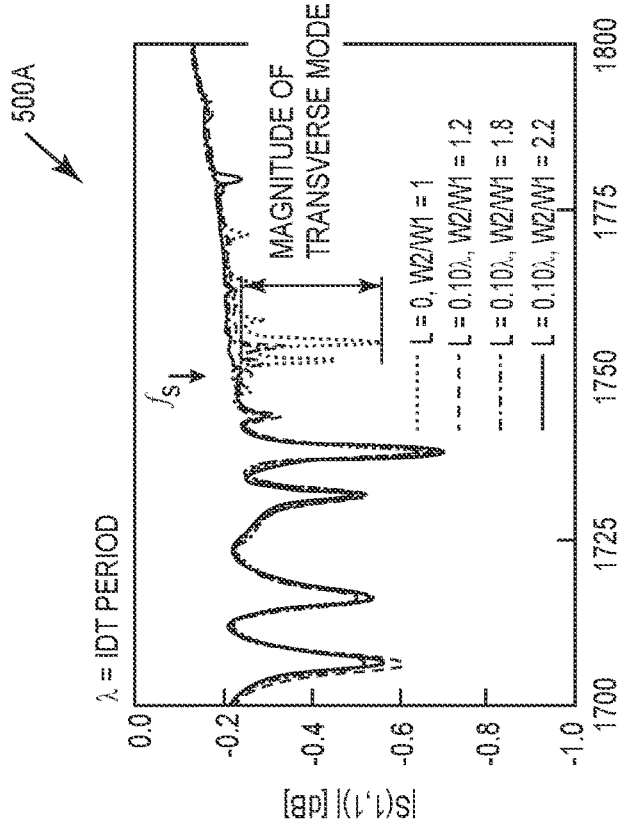
Figure 5C:
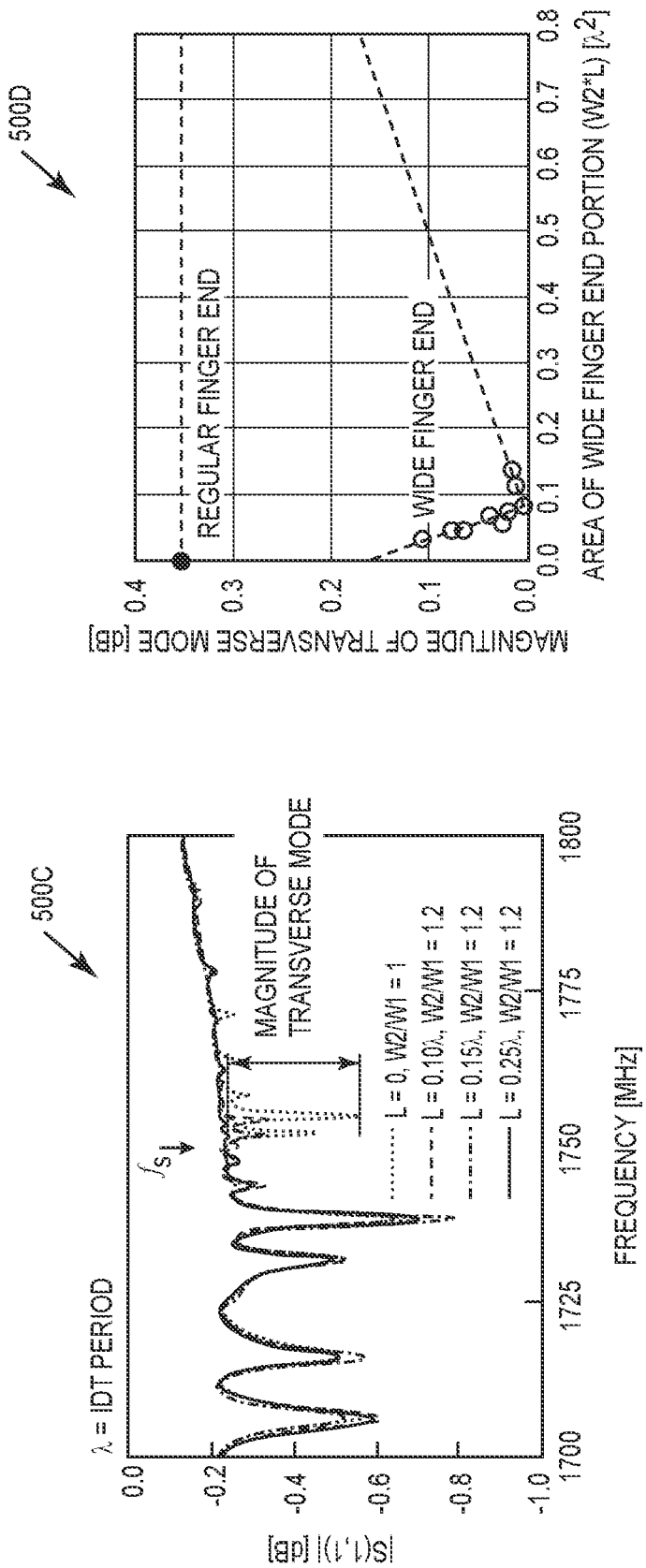
FIG. 5C illustrates how changing the area of a finger end affects a magnitude of a transverse mode.

There are a number of parameters associated with the finger ends which may be optimized to achieve desired transverse mode suppression. FIG. 5A is provided which merely reillustrates an exemplary finger 306(X). FIGS. 5B and 5C illustrate the ramifications of two parameter variations. FIG. 5B illustrates how changing the ratio of W2/W1 will affect how much the transverse mode is suppressed while FIG. 5C illustrates how changing L and the area of the terminal end portion 312(X) will affect how much the transverse mode is suppressed In this regard, FIG. 5B shows graphs 500A and 500B with L set to 0.12 and various W2/W1 ratios. Specifically, ratios of 1.2, 1.8, and 2.2 are illustrated, with the transverse mode being increasing increasingly suppressed as the W2/W1 ratio increases. However, if the W2/W1 ratio is too large (i.e., W2 is too wide), there may be bridging to an adjacent finger, so the W2/W1 ratio may have a practical limit of three (3) or less.

FIG. 5C illustrates graphs 500C, 500D showing what happens to transverse mode suppression with changes to L, while holding W2/W1 constant. Specifically, L is varied between 0.1λ, 0.15λ, and 0.25λ. The data suggests that the greatest transverse mode suppression occurs around $0.1\lambda^2$. Areas larger than this show that the magnitude of the transverse mode slowly increases, and an area greater than approximately $0.7\lambda^2$ will obviate any transverse mode suppression. Approximately as used herein means within five percent.

Figure 6A:
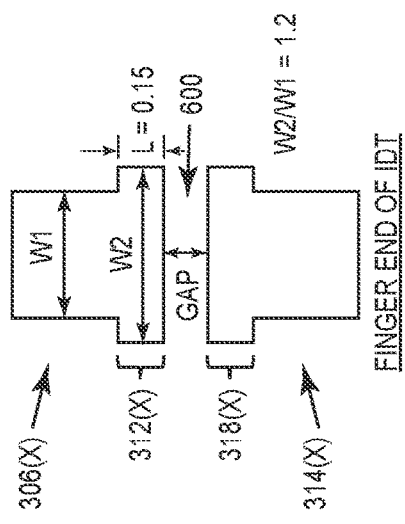
FIGS. 6A and 6B illustrate how changing a gap between finger ends affects a magnitude of a transverse mode.
Figure 6B:
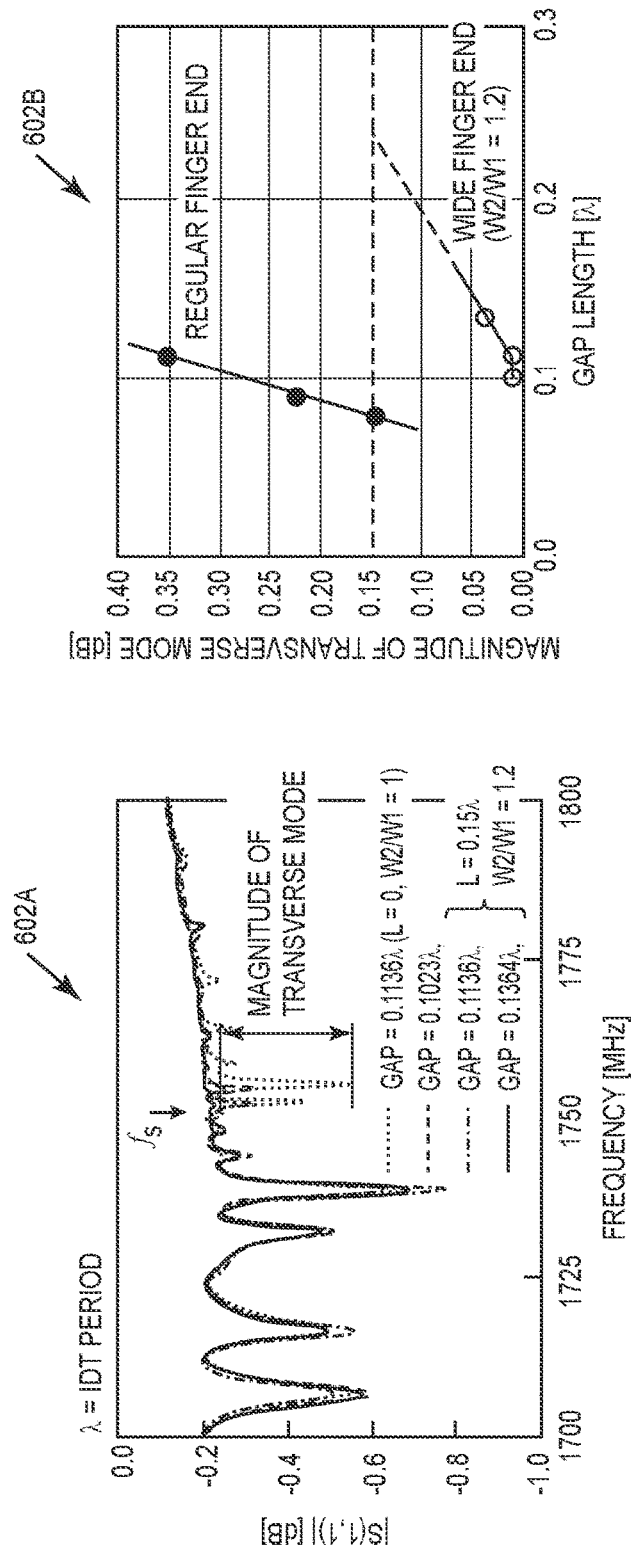

Similarly, a gap 600 illustrated in FIG. 6A between the terminal end portions (e.g., end portions 312(X) and 318(X)) of the fingers 306(X), 314(X) may be varied to achieve varied results. FIG. 6B shows the results of such variation in gap. Specifically, graphs 602A, 602B show how changing the gap from 0.1023λ, through 0.1136λ, to 0.1364λ while keeping L and W/W2 constant affects the magnitude of the transverse mode. If the gap 600 is 0.24λ or less, the wider terminal end portions of the present disclosure provide more effective transverse mode suppression than narrowing the gap of a conventional finger. Note that if the gap is too narrow, it may be difficult to manufacture with current technologies, and accordingly, a gap 600 of more than approximately 0.1 micrometers may be used.

Figure 7A:
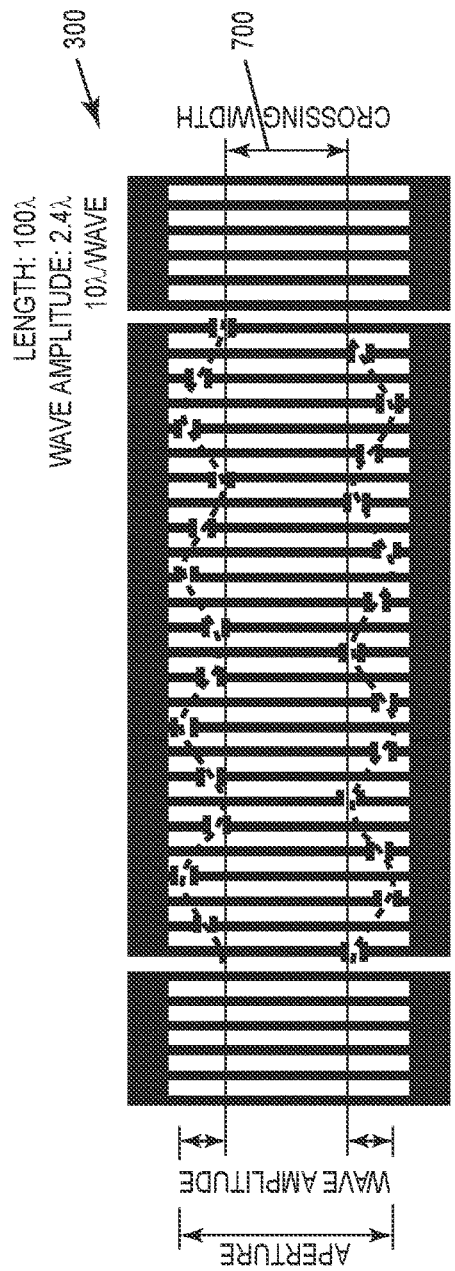
FIGS. 7A and 7B illustrate how changing a crossing gap between fingers affects a magnitude of a transverse mode.
Figure 7B:
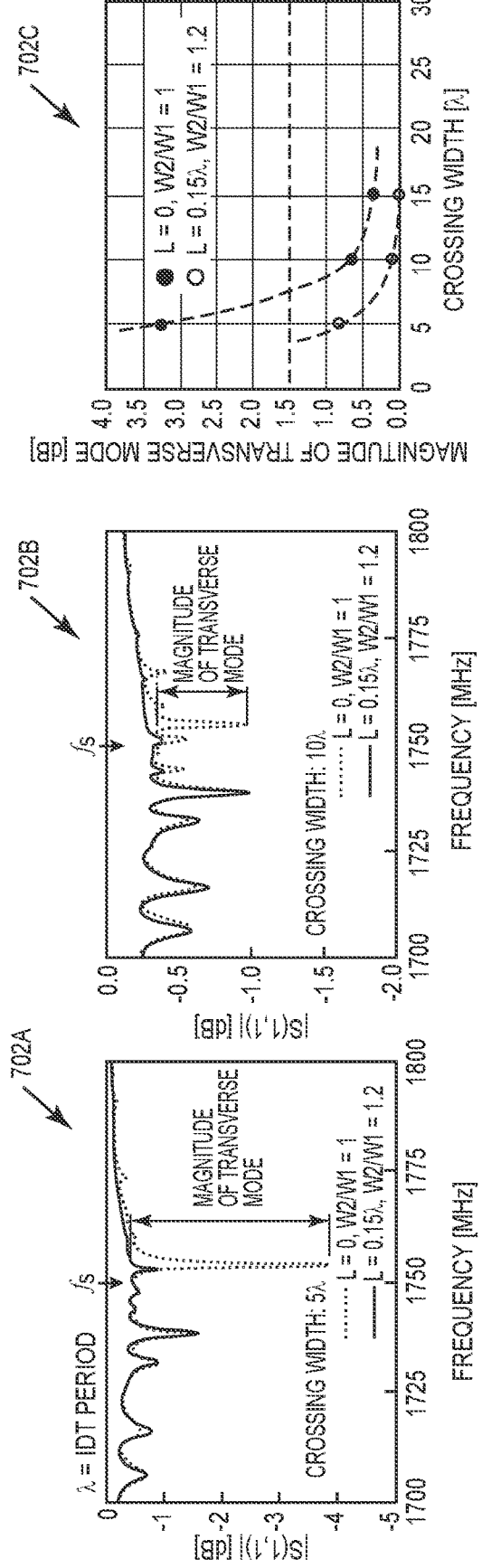

Still another parameter may be a crossing width 700 illustrated in FIG. 7A. FIG. 7B illustrates graphs 702A, 702B, and 702C showing the impact on the transverse mode suppression created by variations in the crossing width 700. Specifically, a crossing width of 5λ is shown in graph 702A and a crossing width 700 of 10λ is shown in graph 702B. The effect of the wide terminal end portions 312(1)-312(N) and 318(1)-318(N) is greater as the crossing width 700 is smaller. However, if the crossing width 700 is too narrow, the distance between the upper and lower apodization regions are too close, so a crossing width 700 of at least approximately 1λ is suggested.

Figure 8:
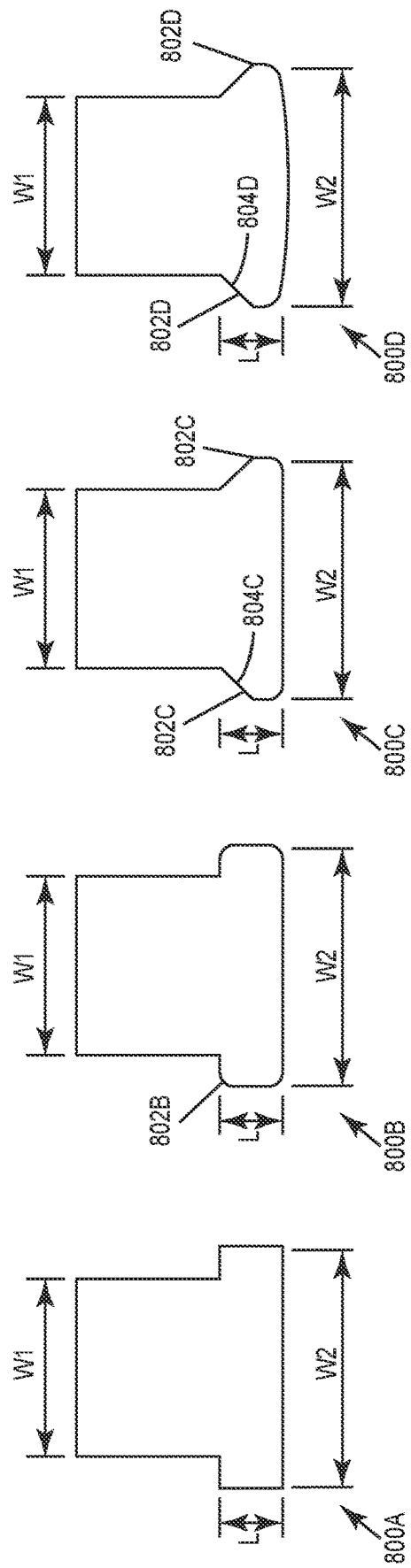
FIG. 8 illustrates various alternate finger ends.

While FIGS. 3A, 5A, 6A, and 7A suggest that the terminal end portions 312(1)-312(N) and 318(1)-318(N) be rectilinear with right angles at the corners, the present disclosure is not so limited. FIG. 8 provides exemplary alternate terminal end portions 800A-800D where terminal end portion 800A is rectilinear as previously illustrated, but terminal end portions 800B-800D include rounded corner portions 802B, 802C, 802D. The precise radius of curvature and the precise angle of slope 804C, 804D is not central to the present disclosure and may be varied without departing from the scope of the present disclosure. Likewise, minor variations that result from process variations during manufacture are intended to be included within the present disclosure.

FIGS. 9A and 9B show the impact variations on the thickness (LT) of the piezoelectric material 900 that sits between the interdigitated electrodes 302, 304 and a silicon substrate 904 have on transverse mode suppression. It should be appreciated that the piezoelectric material 900 may be, for example, lithium tantalite or lithium niobite. Likewise, while described as a silicon substrate 904, the substrate may alternatively be sapphire, spinel, quartz, or other ceramics. As shown by graphs 906A and 906B in FIG. 9B, the magnitude of a transverse mode may depend on the thickness of the piezoelectric material 900. When the piezoelectric material 900 is less than 5λ, transverse modes are seen, and using the wide terminal end portions of the present disclosure may be useful when suppressing transverse modes when LT is less than approximately 5λ.

Figure 10:
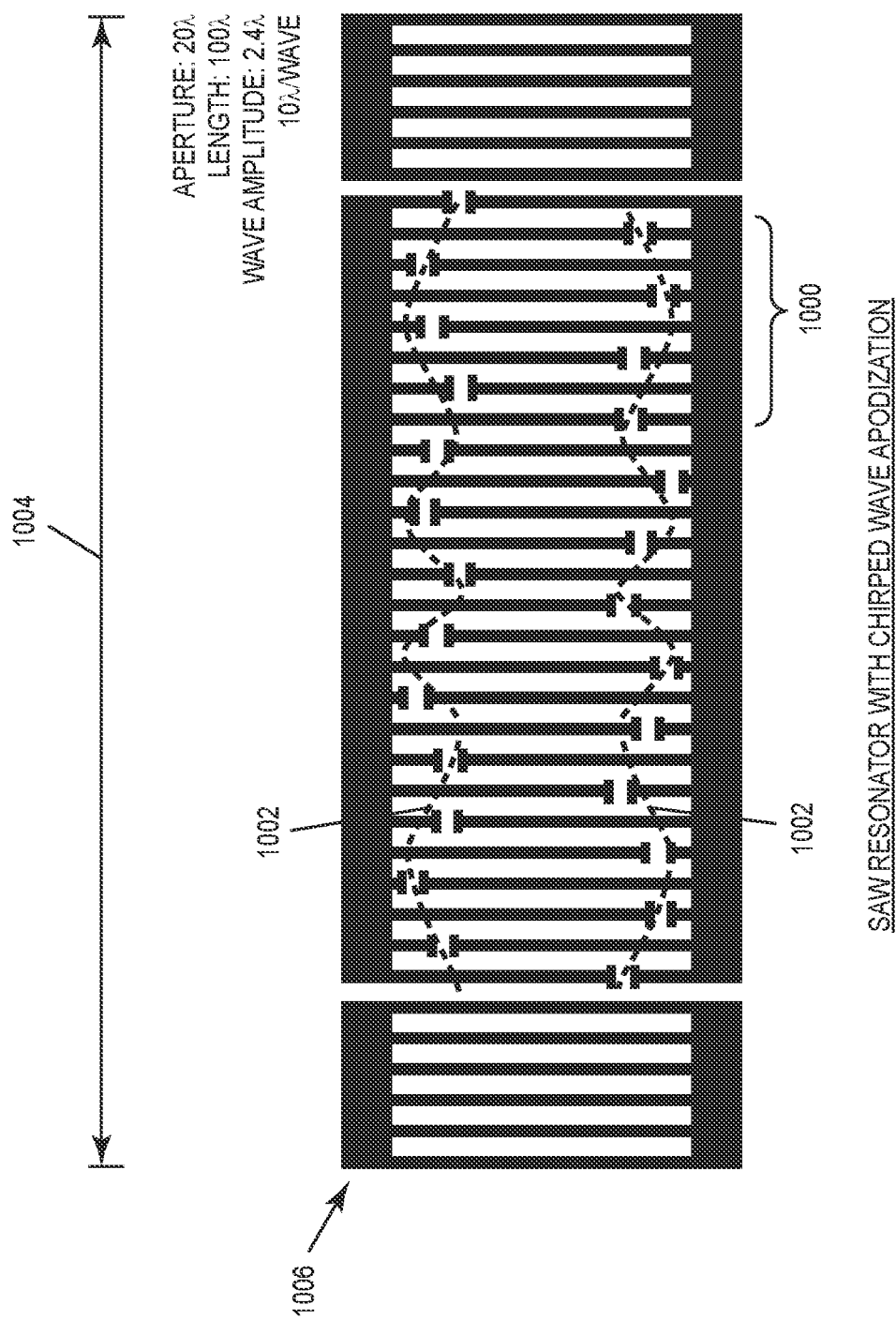
FIG. 10 illustrates a top plan view of an alternate guided SAW structure with a chirped wave apodization.

Still another possible variation is to chirp the wave apodization as illustrated in FIG. 10. That is, some portion 1000 of a wave 1002 has a different period than the rest of the wave 1002. In an exemplary aspect, the chirped wave is symmetric about a vertical axis to a length direction 1004 of a SAW filter 1006.

The surface acoustic wave structures with transverse mode suppression according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. A surface acoustic wave (SAW) filter comprising:
a first interdigitated electrode consisting of a first plurality of fingers, each finger of the first plurality comprising:
a substantially uniform first width along a longitudinal axis of the finger for a first length and a second width along the longitudinal axis of the finger for a second length at a terminal end portion of the finger; and
a second interdigitated electrode consisting of a second plurality of second fingers, each second finger of the second plurality comprising:
a substantially uniform third width along a second longitudinal axis of the second finger for a third length and a fourth width along the second longitudinal axis of the second finger for a fourth length at a second terminal end of the second finger;
wherein each of the first plurality of fingers has a respective opposite one of the second plurality of second fingers, and each pair of first finger and second finger has a gap therebetween.

2. The SAW filter of claim 1, wherein the first interdigitated electrode is apodized in a length direction of the SAW filter.

3. The SAW filter of claim 1, wherein the first interdigitated electrode is apodized with a wave pattern in a length direction of the SAW filter.

4. The SAW filter of claim 1, wherein the second width is greater than the first width but less than three times the first width.

5. The SAW filter of claim 1, wherein the second width is greater than the first width by less than 2.5 times the first width.

6. The SAW filter of claim 1, wherein the terminal end portion of each of the fingers has an area corresponding to the second width multiplied by the second length and this area is less than approximately $0.7\lambda^2$, where $\lambda$ is an interdigital transducer (IDT) period of the SAW filter.

7. The SAW filter of claim 1, wherein the terminal end portion of each of the fingers has an area corresponding to the second width multiplied by the second length and this area is less than approximately $0.3\lambda^2$, where $\lambda$ is an interdigital transducer (IDT) period of the SAW filter.

8. The SAW filter of claim 1, wherein the gap is between approximately 0.1 micrometers and $0.24\lambda$, where $\lambda$ is an interdigital transducer (IDT) period of the SAW filter.

9. The SAW filter of claim 1, wherein the gap is between approximately 0.1 micrometers and $0.14\lambda$, where $\lambda$ is an interdigital transducer (IDT) period of the SAW filter.

10. The SAW filter of claim 1, wherein there is a crossing width defined by the first finger and the second finger.

11. The SAW filter of claim 10, wherein the crossing width is greater than $5\lambda$, where $\lambda$ is an interdigital transducer (IDT) period of the SAW filter.

12. The SAW filter of claim 10, wherein the crossing width is greater than $5\lambda$, where $\lambda$ is an interdigital transducer (IDT) period of the SAW filter.

13. The SAW filter of claim 1, wherein the terminal end portion comprises a rounded corner portion.

14. The SAW filter of claim 1, further comprising a piezoelectric layer, the first interdigitated electrode and the second interdigitated electrode positioned on the piezoelectric layer.

15. The SAW filter of claim 14, wherein the piezoelectric layer comprises either lithium tantalite or lithium niobite.

16. The SAW filter of claim 14, further comprising a support substrate, wherein the piezoelectric layer is bonded on the support substrate.

17. The SAW filter of claim 14, wherein the piezoelectric layer has a thickness less than $5\lambda$, where $\lambda$ is an interdigital transducer (IDT) period of the SAW filter.

18. The SAW filter of claim 16, further comprising a silicon dioxide layer between the piezoelectric layer and the support substrate.

19. A mobile communication device comprising:
a transmitter comprising a surface acoustic wave (SAW) filter comprising:
a first interdigitated electrode consisting of a first plurality of fingers, each finger of the first plurality comprising:
a substantially uniform first width along a longitudinal axis of the finger for a first length and a second width along the longitudinal axis of the finger for a second length at a terminal end portion of the finger; and
a second interdigitated electrode consisting of a second plurality of second fingers, each second finger of the second plurality comprising:
a substantially uniform third width along a second longitudinal axis of the second finger for a third length and a fourth width along the second longitudinal axis of the second finger for a fourth length at a second terminal end of the second finger;

wherein each of the first plurality of fingers has a respective opposite one of the second plurality of second fingers and each pair of first finger and second finger has a gap therebetween.

\* \* \* \* \*

UNITED STATES PATENT AND TRADEMARK OFFICE
CERTIFICATE OF CORRECTION

PATENT NO. : 12,143,090 B2
APPLICATION NO. : 17/452825
DATED : November 12, 2024
INVENTOR(S) : Tsuyoshi Yokoyama et al.

It is certified that error appears in the above-identified patent and that said Letters Patent is hereby corrected as shown below:

In the Specification

In Column 3, Line 57, replace "to 20λ, 100λ, and 1λ" with --to 20λ, 100λ, and 10λ--.

In Column 4, Line 5, replace "set to 0.12" with --set to 0.1λ--.

In Column 4, Line 41, replace "crossing width 700 of 102" with --crossing width 700 of 10λ--.

In the Claims

In Column 6, Line 29, replace "greater than 52" with --greater than λ--.

Signed and Sealed this
Tenth Day of December, 2024

Katherine Kelly Vidal
*Director of the United States Patent and Trademark Office*